United States Patent
Yoon (10) Patent No.: US 7,863,613 B2
(45) Date of Patent: Jan. 4, 2011

(54) THIN FILM TRANSISTOR ARRAY OF HORIZONTAL ELECTRONIC FIELD APPLYING TYPE AND METHOD FOR FABRICATING THE SAME

(75) Inventor: Sang Pil Yoon, Gyeongsangbuk-do (KR)

(73) Assignee: LG Display Co., Ltd., Seoul (KR)

( * ) Notice: Subject to any disclaimer, the term of this patent is extended or adjusted under 35 U.S.C. 154(b) by 247 days.

(21) Appl. No.: 12/216,681

(22) Filed: Jul. 9, 2008

(65) Prior Publication Data

US 2009/0014723 A1 Jan. 15, 2009

(30) Foreign Application Priority Data

Jul. 10, 2007 (KR) .................. 10-2007-0069174

(51) Int. Cl.
- H01L 29/00 (2006.01)
- H01L 21/00 (2006.01)
- G02F 1/1343 (2006.01)

(52) U.S. Cl. .......... 257/59; 257/E33.001; 257/E21.001; 438/29; 438/158; 349/141

(58) Field of Classification Search .................. 257/59, 257/E21.001, E33.001; 438/29, 158; 349/141
See application file for complete search history.

(56) References Cited

U.S. PATENT DOCUMENTS

2007/0153206 A1* 7/2007 Lim et al. .................. 349/141

* cited by examiner

Primary Examiner—Lex Malsawma
(74) Attorney, Agent, or Firm—Morgan, Lewis & Bockius LLP (57) ABSTRACT

A thin film transistor array of a horizontal electronic field applying type enhances brightness. The thin film transistor array includes a gate line and common line separated from the gate line; a data line crossing with the gate line to define pixel region and insulated from the gate line by a gate insulating film; a TFT connected to the gate line and the data line in the pixel region; a pixel electrode on a passivation film overlapping with the common line in the pixel region and connected to the TFT; and a common electrode on the passivation film opposed to the pixel electrode in the pixel region and connected to the common line, wherein the width of the pixel electrode at the overlapping portion between the common line and the pixel electrode is narrower than the width of the common line, and the edge of one side of the pixel electrode adjacent to the common electrode is formed on the inside of the edge of one side of the common line adjacent to the common electrode.

14 Claims, 12 Drawing Sheets

FIG. 1
Relate Art

THIN FILM TRANSISTOR ARRAY OF HORIZONTAL ELECTRONIC FIELD APPLYING TYPE AND METHOD FOR FABRICATING THE SAME

This application claims the benefit of Korean Patent Application No. 2007-069174, filed Jul. 10, 2007, which is hereby incorporated by reference as if fully set forth herein.

BACKGROUND OF THE INVENTION

1. Field of the Invention

The present invention relates to a thin film transistor array of a horizontal electronic field applying type, and more particularly, to a thin film transistor array of a horizontal electronic field applying type, which enhances brightness and a method for fabricating the same.

2. Discussion of the Related Art

Generally, liquid crystal display devices display an image by adjusting light transmittance of liquid crystals using an electronic field. These liquid crystal display devices are divided into a vertical electronic field applying type and a horizontal electronic field applying type according to directions of electronic fields driving liquid crystals.

A liquid crystal display device of a vertical electronic field applying type drives liquid crystals using vertical electronic fields formed between pixel electrodes and common electrodes disposed opposite to each other on upper and lower substrates. Such a liquid crystal display device has the advantage of a high aperture ratio, but has the disadvantage of a narrow viewing angle.

A liquid crystal display device of a horizontal electronic field applying type drives liquid crystals using horizontal electronic fields formed between pixel electrodes and common electrodes disposed in parallel on a lower substrate. Such a liquid crystal display device has the advantage of a wide viewing angle.

Figure 1:
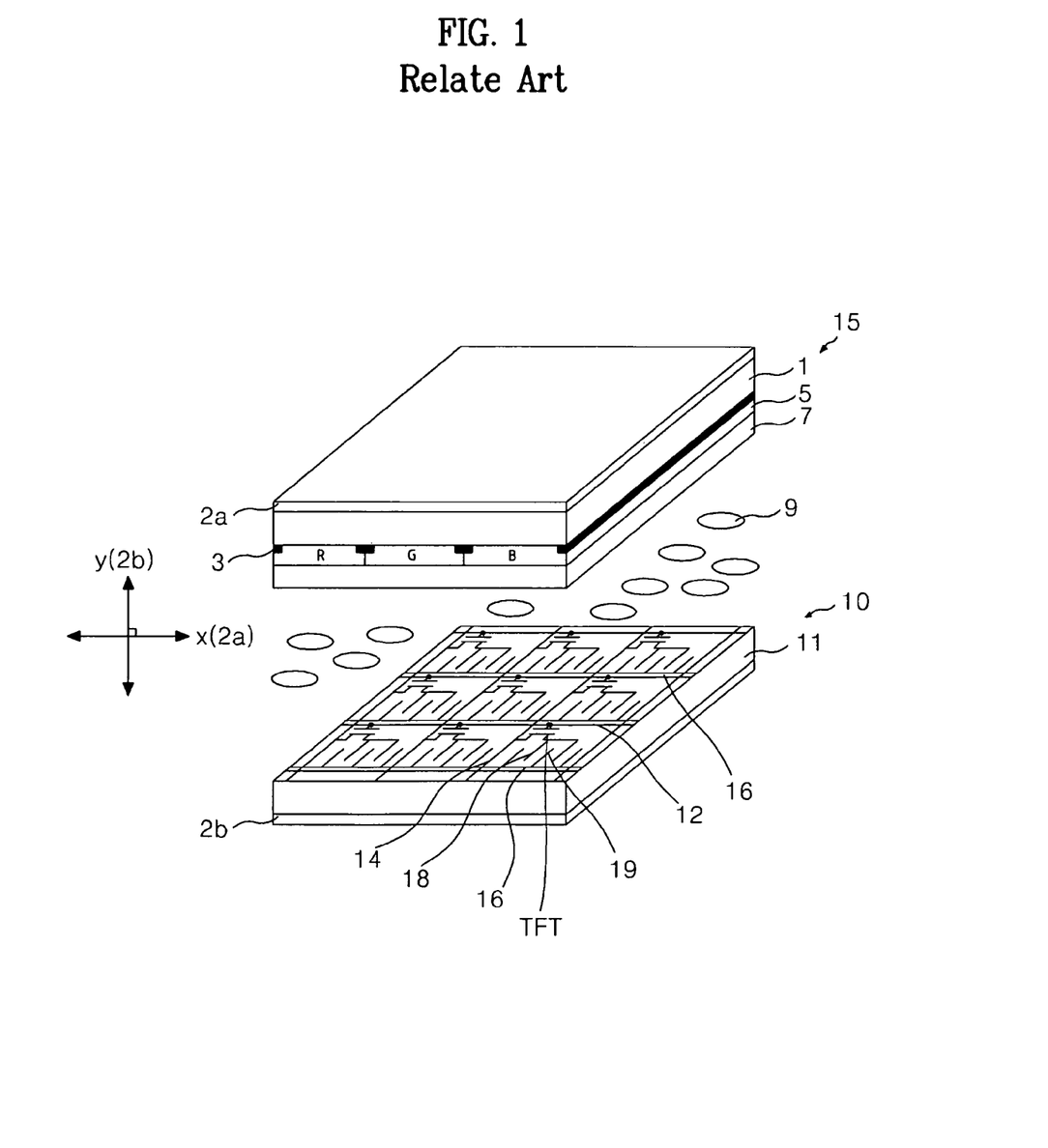
FIG. 1 is a schematic view illustrating a liquid crystal display device of a horizontal electronic field applying type.

With reference to FIG. 1, a liquid crystal display device of a horizontal electronic field applying type includes a thin film transistor (TFT) array 10 and a color filter array 15, which are opposed to each other with liquid crystals 9 interposed therebetween.

The color filter array 15 includes a black matrix 3, color filters 5, and an overcoat layer 7, which are sequentially formed on an upper substrate 1. The black matrix 3 serves to prevent leakage of light and optical interference between the neighboring color filters 5. The color filters 5 include red (R), green (G), and blue (B) color filters, and thus allow the liquid crystal display device to display colors. The overcoat layer 7 serves to level the upper substrate 1, on which the black matrix 3 and the color filters 5 are formed.

The TFT array 10 includes gate lines 12 and data lines 14, which cross each other on a lower substrate 11 to define pixel regions, TFTs, which are respectively connected to the gate lines 12 and the data lines 14, pixel electrodes 18, which are respectively connected to the TFTs, common electrodes 19, which are parallel with the pixel electrodes 18, and common lines 16, which are respectively connected to the common electrodes 19.

The TFTs supply a data signal from the data line 14 to the pixel electrode 18 in response to a gate signal from the gate line 12. A horizontal electronic field is formed between the pixel electrode 18, to which the data signal is supplied through the TFT, and the common electrode 19, to which a reference voltage is supplied through the common line 16. The liquid crystals 9 are rotated by the horizontal electronic field. The rotating degree of the liquid crystals 9 is adjusted according to the data signal. As described above, the liquid crystal display device of the horizontal electronic field applying type varies transmittance of light transmitting the pixel regions by adjusting the rotating degree of the liquid crystals 9 using the horizontal electronic field, and thus displays an image.

An upper polarizing plate 2a and a lower polarizing plate 2b, which transmit light polarized at a specific direction, are respectively attached to the outer surfaces of the upper substrate 1 and the lower substrate 11. Generally, a transmission axis (x) of the upper polarizing plate 2a and a transmission axis (y) of the lower polarizing plate 2b are perpendicular to each other.

As described above, the liquid crystal display device of the horizontal electronic field applying type varies transmittance of light transmitting the pixel regions by adjusting the rotating degree of the liquid crystals using the horizontal electronic field, and thus displays an image. Here, the liquid crystals 9 driven by the horizontal electronic field can contribute to brightness of the liquid crystal display device, only when the major axes of the liquid crystals 9 are oblique to the transmission axes (x and y) of the upper and lower polarizing plates 2a and 2b. That is, light transmitting the liquid crystals 9, the major axes of which are parallel with the transmission axes (x and y) of the upper and lower polarizing plates 2a and 2b, cannot transmit the upper polarizing plate 2a, thus lowering brightness.

The above liquid crystal display device of the horizontal electronic field applying type has been developed toward the enhancement of an aperture ratio and a light transmittance by designing the common electrode 19 and the pixel electrode 18 in various methods. As one method, a structure, in which the common electrode 19 and the pixel electrode 18 are formed on the same layer with transparent conductive metals, was proposed. In this case, the common electrode 19 is connected to the common line 16 through a hole, and thus a reference voltage is supplied from the common line 16 to the common electrode 19. Further, the common line 16 is extended so as to overlap with portions of the pixel electrode 18 on condition that an insulating film is interposed therebetween, thereby forming storage capacitor (Cst). The storage capacitor (Cst) stably maintains a signal supplied to the pixel electrode 18. When a liquid crystal display device of a horizontal electronic field applying type including these storage capacitor (Cst) is driven, an electronic field formed between the storage capacitor (Cst) and the end of the common electrode 19 causes the major axes of the liquid crystals 9 to be driven in parallel with the transmission axes (x and y) of the upper and lower polarizing plates 2a and 2b. Light transmitting the liquid crystals 9, the major axes of which are parallel with the transmission axes (x and y) of the upper and lower polarizing plates 2a and 2b, cannot transmit the upper polarizing plate 2a, thus lowering the brightness of the liquid crystal display device.

SUMMARY OF THE INVENTION

Accordingly, the present invention is directed to a thin film transistor array of a horizontal electronic field applying type.

One object of the present invention is to provide a thin film transistor array of a horizontal electronic field applying type, which enhances brightness and a method for fabricating the same.

To achieve this object and other advantages and in accordance with the purpose of the invention, as embodied and broadly described herein, a thin film transistor array of a horizontal electronic field applying type includes a gate line and common line separated from the gate line; a data line crossing with the gate line to define pixel region and insulated from the gate line by a gate insulating film; a TFT connected to the gate line and the data line in the pixel region; a pixel electrode on a passivation film overlapping with the common line in the pixel region and connected to the TFT; and a common electrode on the passivation film opposed to the pixel electrode in the pixel region and connected to the common line, wherein the width of the pixel electrode at the overlapping portion between the common line and the pixel electrode is narrower than the width of the common line, and the edge of one side of the pixel electrode adjacent to the common electrode is formed on the inside of the edge of one side of the common line adjacent to the common electrode.

A horizontal distance between the edge of one side of each of the pixel electrodes and the edge of one side of each of the common lines may be 1~2 μm.

The common line may include a horizontal part being parallel with the gate lines; a first vertical part protruding from the horizontal part to the pixel region parallel with the data lines, and overlapping with the pixel electrode; and a second vertical part protruding from the horizontal part to the pixel region parallel with the data line, and being separated from the first vertical part.

The pixel electrode may include a pixel electrode connection part overlapping with the first vertical part; and a plurality of pixel electrode finger parts protruding from the pixel electrode connection part to a space formed between the first and second vertical parts.

The common electrode may include a common electrode connection part overlapping with the second vertical part; and a plurality of common electrode finger parts protruding from the common electrode connection part to the space formed between the first and second vertical parts, and being disposed in parallel with the plurality of pixel electrode finger parts such that the plurality of common electrode finger parts and the plurality of pixel electrode finger parts alternate with each other.

The first vertical part and the pixel electrode connection part, which overlap with each other on condition that the gate insulating film and the passivation film are interposed therebetween, may form a storage capacitor.

The width of the pixel electrode connection part may be 3~5 μm.

It is to be understood that both the foregoing general description and the following detailed description of the present invention are exemplary and explanatory and are intended to provide further explanation of the invention as claimed.

A method for fabricating thin film transistor array of a horizontal electronic field applying type includes forming a gate line and common line separated from the gate line; forming a gate insulating film; forming a data line crossing with the gate line to define pixel region and insulated from the gate line by the gate insulating film; forming a TFT connected to the gate line and the data line in the pixel region; forming a passivation film; forming a pixel electrode on the passivation film overlapping with the common line in the pixel region and connected to the TFT; and forming a common electrode on the passivation film opposed to the pixel electrode in the pixel region and connected to the common line, wherein the width of the pixel electrode at the overlapping portion between the common line and the pixel electrode is narrower than the width of the common line, and the edge of one side of the pixel electrode adjacent to the common electrode is formed on the inside of the edge of one side of the common line adjacent to the common electrode.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a TFT array of a horizontal electronic field applying type in accordance with a preferred embodiment of the present invention will be described with reference to FIGS. 2 to 8B.

Figure 2:
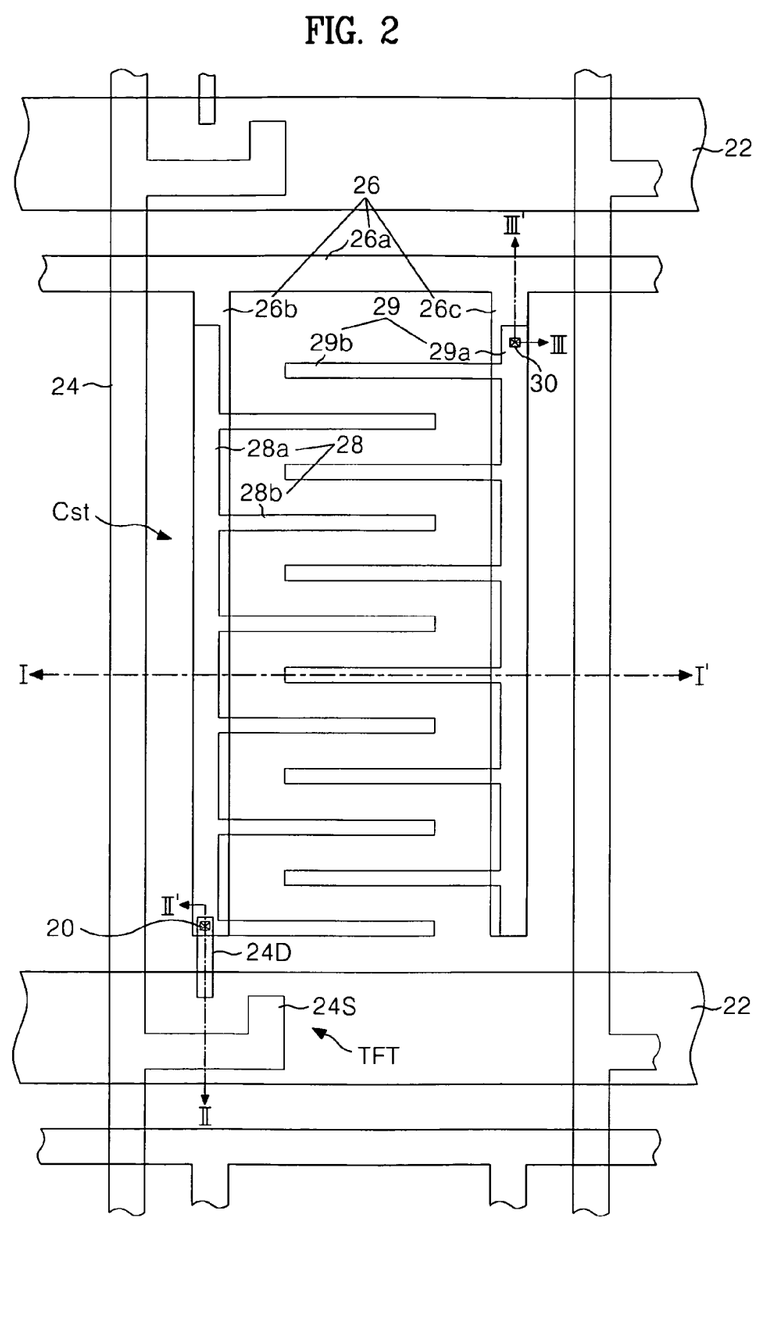
FIG. 2 is a plan view of a thin film transistor array of a horizontal electronic field applying type in accordance with one embodiment of the present invention.
Figure 3:
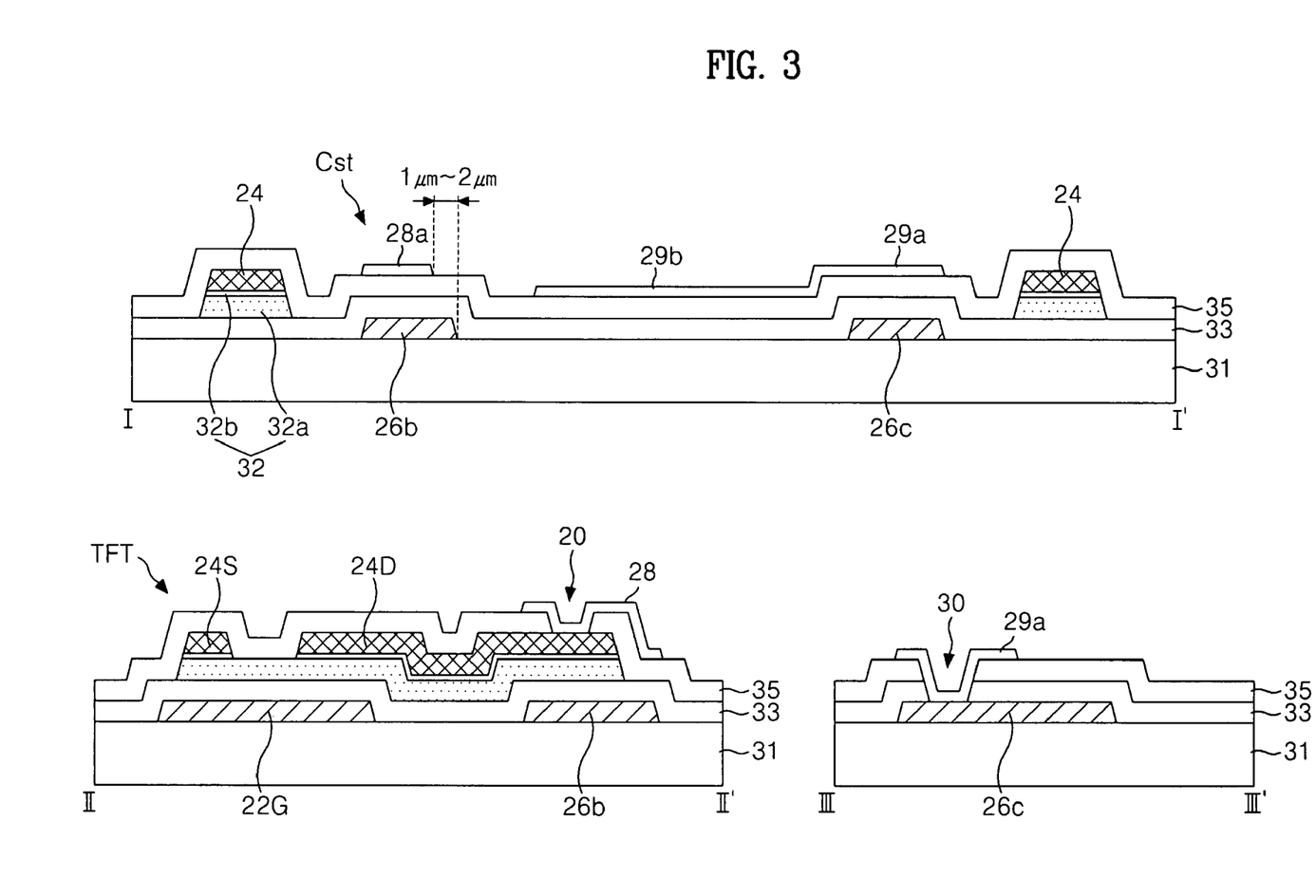
FIG. 3 illustrates cross-sectional views of the thin film transistor array of FIG. 2, respectively taken along the lines 'I-I', 'II-II', and 'III-III'.

FIG. 2 is a plan view of a TFT array of a horizontal electronic field applying type in accordance with one embodiment of the present invention, and FIG. 3 illustrates cross-sectional views of the TFT array of FIG. 2, respectively taken along the lines 'I-I', 'II-II', and 'III-III'.

With reference to FIGS. 2 and 3, a TFT array of a horizontal electronic field applying type in accordance with one embodiment of the present invention includes a plurality of gate lines 22 and a plurality of data lines 24 crossing each other on a substrate 31 with a gate insulating film 33 interposed therebetween, to define pixel regions, TFT connected to the gate line 22 and the data line 24, pixel electrode 28 connected to the TFT, common electrode 29 forming horizontal electronic fields together with the pixel electrode 28, common line 26 connected to the common electrode 29, and storage capacitor (Cst) obtained by overlapping the pixel electrode 28 and the common line 26 with each other.

The gate line 22 and the data line 24 are connected to a driving circuit unit at the outside of the TFT array, and thus supply a gate signal and a data signal to the TFT. Further, the common line 26 is formed on the same layer as the gate line 22 on condition that the common line 29 are separated from the gate line 22, and are connected to the driving circuit unit at the outside of the TFT array, thus supplying a reference voltage for driving liquid crystals to the common electrode 26.

The TFT supplies the data signal of the data lines 24 to the pixel electrode 28 in response to the gate signal of the gate line 22. For this reason, the TFT includes a gate electrode 22G connected to the gate line 22, a source electrode 24S connected to the data line 24, a drain electrode 24D connected to the pixel electrode 28, and a semiconductor pattern 32 overlapping with the gate electrode 22G on condition that the gate insulating film 33 is interposed therebetween, and connected to the source electrode 24S and the drain electrode 24D.

The semiconductor pattern 32 includes an active layer 32a, and an Ohmic contact layer 32b formed on the active layer 32a. The active layer 32a is exposed between the source electrode 24S and the drain electrode 24D, and thus forms a semiconductor channel. The Ohmic contact layer 32b forms Ohmic contact between the active layer 32a and the source electrode 24S and Ohmic contact between the active layer 32a and the drain electrode 24D. This semiconductor pattern 32, formed under a source/drain conductive pattern group, overlaps with the source/drain conductive pattern group including the source electrode 24S, the drain electrode 24D, and the data line 24 due to characteristics of its manufacturing process.

The common line 26 needs to be connected to the common electrode 29 so as to supply a reference voltage for forming a horizontal electronic field to the common electrode 29 and overlap with the pixel electrode 28 so as to form the storage capacitor (Cst) together with the pixel electrode 28. Further, the pixel electrode 28 and the common electrode 29 need to be made of a transparent conductive pattern so as to enhance transmittance and be parallel with each other so as to form the horizontal electronic field. In order to satisfy the above requirements, the structures of the common line 26, the pixel electrode 28, and the common electrode 29 will be described below in detail.

The common line 26 includes a horizontal part 26a, which is parallel with the gate line 22, a first vertical part 26b, which protrudes from the horizontal part 26a to the pixel region parallel with the data line 24 and overlaps with the pixel electrode 28, and a second vertical part 26c, which protrudes from the horizontal part 26a to the pixel region parallel with the data line 24 and is separated from the first vertical part 26b.

The pixel electrode 28 includes a pixel electrode connection part 28a, which overlaps with the first vertical part 26b, and a plurality of pixel electrode finger parts 28b, which protrudes from the pixel electrode connection part 28a to a space formed between the first and second vertical parts 26b and 26c.

The common electrode 29 includes a common electrode connection part 29a, which overlaps with the second vertical part 26c, and a plurality of common electrode finger parts 29b, which protrudes from the common electrode connection part 29a to the space formed between the first and second vertical parts 26b and 26c and is disposed alternately with the plurality of pixel electrode finger parts 28b.

The pixel electrode connection part 28a is connected to the drain electrode 24D through a pixel contact hole 20, which is formed through a passivation film 35 coating the source/drain conductive pattern to expose the drain electrode 24D. Thereby, the pixel electrode 28 receives the data signal via the drain electrode 24D.

The common electrode connection part 29a is connected to the common line 26 through a common line contact hole 30, which is formed through the passivation film 35 and the gate insulating film 33 to expose the second vertical part 26c. Thereby, the common electrode 29 receives the reference voltage from the common line 26.

Since the pixel electrode finger parts 28b and the common electrode finger parts 29b are disposed in parallel and alternate with each other, when the data signal is supplied to the pixel electrode 28 and the reference voltage is supplied to the common electrode 29, horizontal electronic fields are formed between the pixel electrode finger parts 28b and the common electrode finger parts 29b. When signals are applied to the pixel electrode 28 and the common electrode 29, the signals are applied to an overlapping portion between the common line 26 and the pixel electrode 28, i.e., an overlapping portion between the first vertical part 26b and the pixel electrode connection part 28a. Thereby, an electronic field is formed between the edge of the pixel electrode connection part 28a adjacent to the common electrode 29 and the end of the common electrode finger part 29b. The direction of the electronic field formed between the edge of the pixel electrode connection part 28a and the end of the common electrode finger part 29b differs from the direction of the electronic field formed between the pixel electrode finger part 28b and the common electrode finger part 29b.

Figure 4:
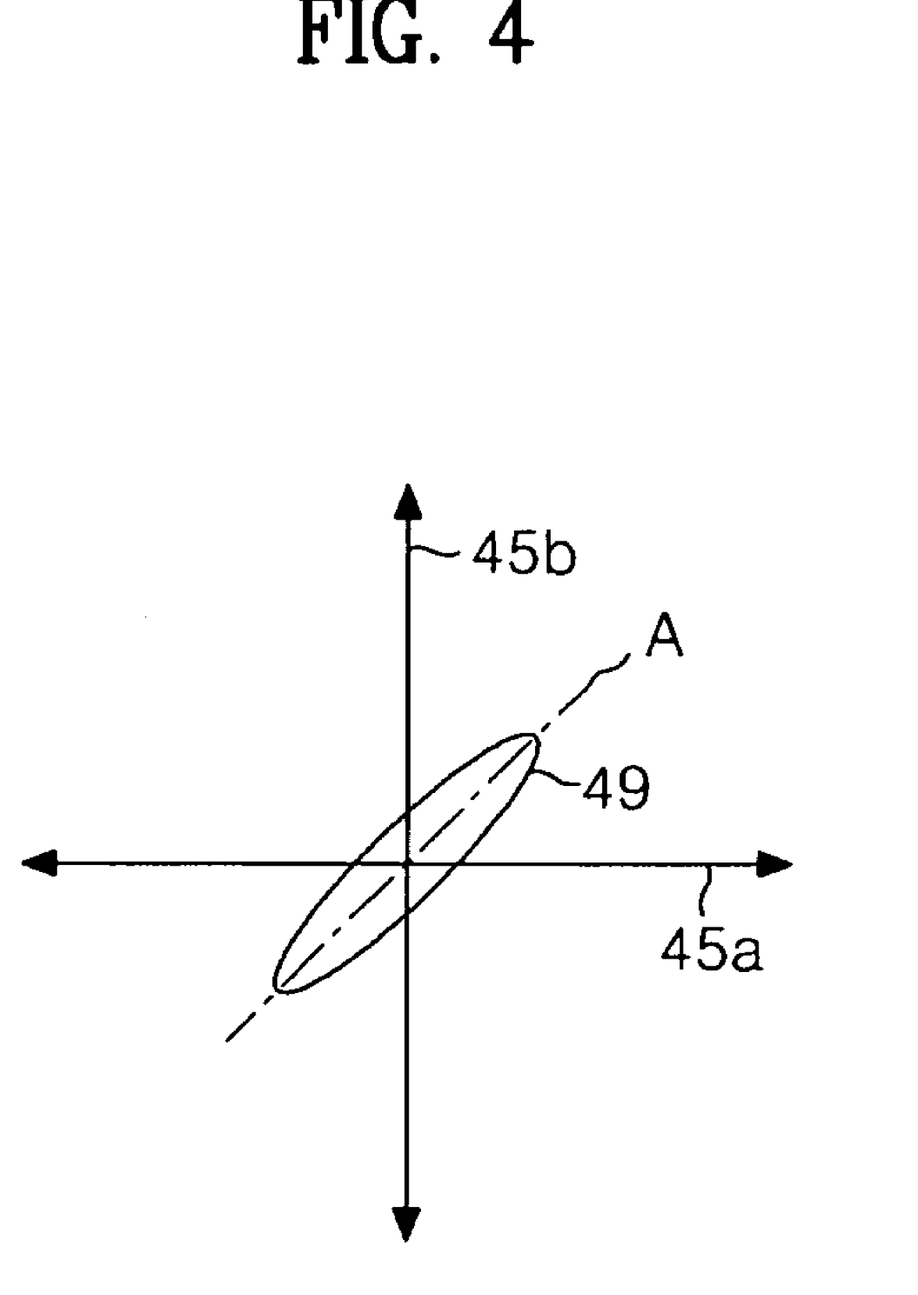
FIG. 4 is a graph illustrating driving characteristics of liquid crystals disposed between a pixel electrode connection part and a common electrode finger part in accordance with the embodiment of the present invention.

In the embodiment of the present invention, the width of the pixel electrode connection part 28a is narrower than that of the first vertical part 26b, and the edge of one side of the pixel electrode connection part 28a adjacent to the common electrode finger parts 29b is formed on the inside of the edge of one side of the first vertical part 26b adjacent to the common electrode finger parts 29b. Thereby, the electronic field between the first vertical part 26b and the pixel electrode connection part 28a is distorted by the first vertical part 26b is closer to the common electrode finger parts 29b than the pixel electrode connection part 28a. The distorted electronic field allows liquid crystals 49 disposed between the pixel electrode connection part 28a and the common electrode finger parts 29b to contribute to the brightness of a liquid crystal display device, as shown in FIG. 4. That is, the liquid crystals 49 disposed between the pixel electrode connection part 28a and the common electrode finger parts 29b are driven by the electronic field distorted by the first vertical part 26b, and thus major axes (A) of the liquid crystals 49 are oblique to transmission axes 45a of upper polarizing plate or transmission axes 45b of lower polarizing plate. Therefore, the TFT array of the horizontal electronic field applying type in accordance with the embodiment of the present invention widens a region contributing brightness, and thus the whole brightness of the TFT array of the horizontal electronic field applying type is enhanced. In order to distort the electronic field formed between pixel electrode connection part 28a and the common electrode finger part 29b by the first vertical part 26b, as described above, a horizontal distance between the edge of one side of the pixel electrode connection part 28a and the edge of one side of the first vertical part 26b is from 1 μm up.

In the embodiment of the present invention, the first vertical part 29b overlaps with the pixel electrode connection part 28a on condition that the passivation film 35 and the gate insulating film 33 are interposed therebetween, thus forming the storage capacitor (Cst). The storage capacitor (Cst) maintains the data signal charged to the pixel electrode 28 through the TFT. In order to stably maintain the data signal in the pixel electrode 28, the storage capacitor (Cst) must have a proper capacity. The capacity of the storage capacitor (Cst) is proportionate to the dimensions of the overlapping portion between the first vertical part 29b and the pixel electrode connection part 28a. Thereby, in the embodiment of the present invention, the horizontal distance between the edge of one side of the pixel electrode connection part 28a and the edge of one side of the first vertical part 26b is less than 2 μm so as to secure the proper capacity of the storage capacitor (Cst) proportionate to the dimensions of the overlapping portion, in consideration of that the width of the pixel electrode connection part 28a is 3~5 μm.

Hereinafter, a method for manufacturing the TFT array in accordance with one embodiment of the present invention will be described with reference to FIGS. 5A to 8B.

Figure 5A:
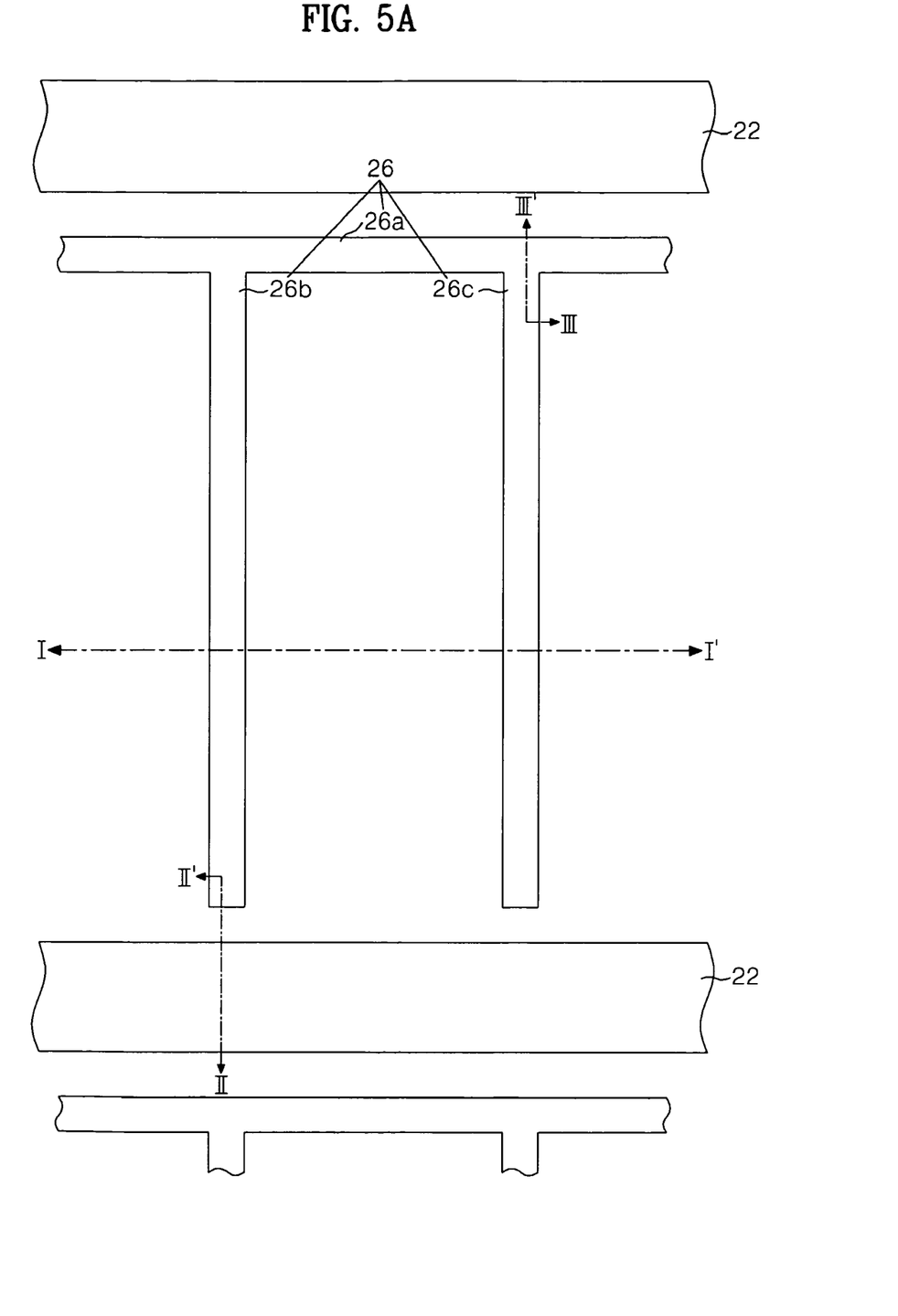
FIGS. 5A and 5B are plan and cross-sectional views illustrating a first mask process of the thin film transistor array in accordance with the embodiment of the present invention.
Figure 5B:
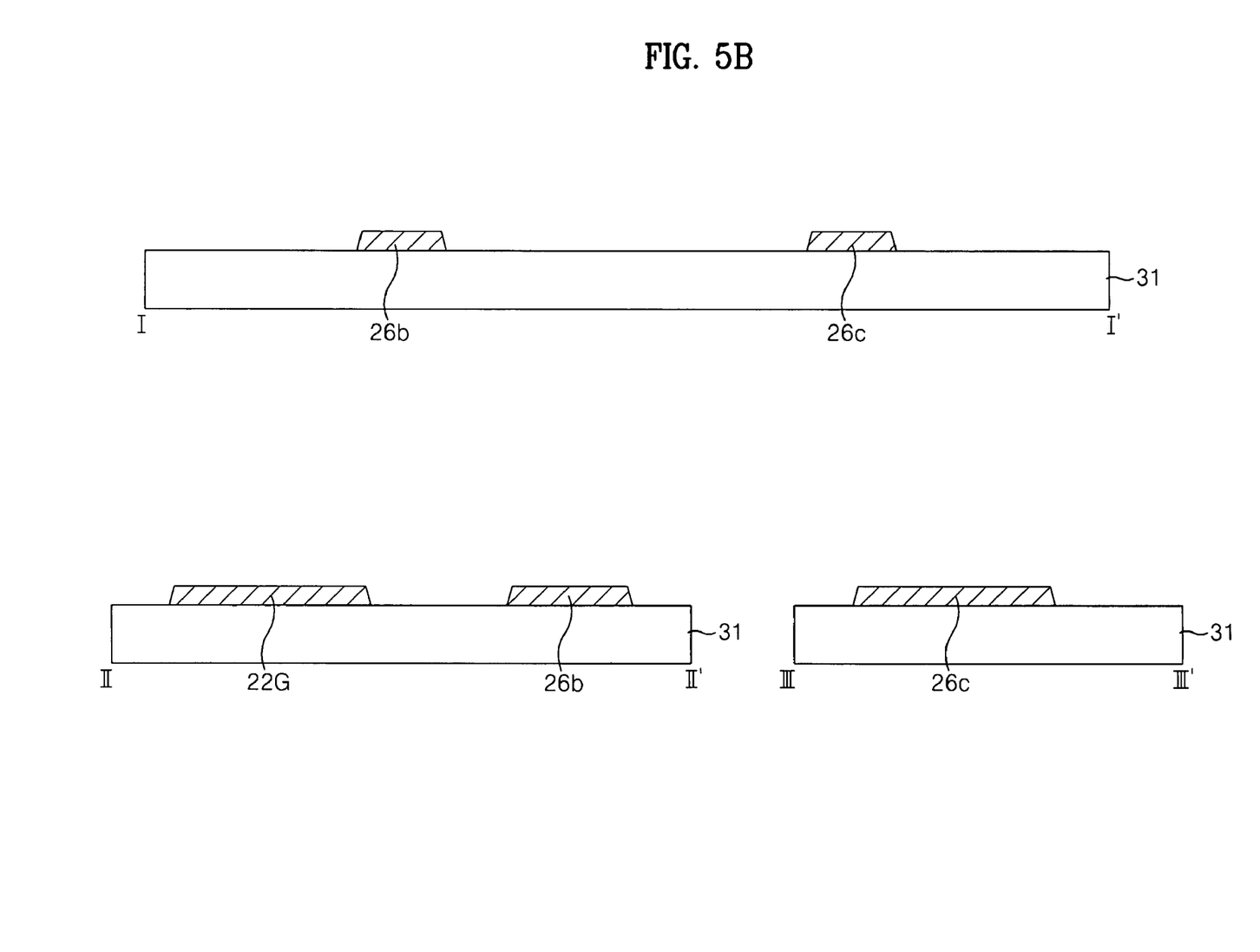

With reference to FIGS. 5A and 5B, a gate conductive pattern including gate lines 22, gate electrodes 22G, and common lines 26 is formed on a substrate 31 through a first mask process.

The gate conductive pattern is obtained by forming a gate metal layer on the substrate 31 and patterning the gate metal layer through the first mask process including a photolithography process and an etching process. A single layer made of a metal material selected from the group consisting of Mo, Ti, Cu, AlNd, Al, Cr, Mo alloys, Cu alloys, and Al alloys, or at least a double layer obtained by stacking two layers made of the above metal material are used as the gate metal layer.

Figure 6A:
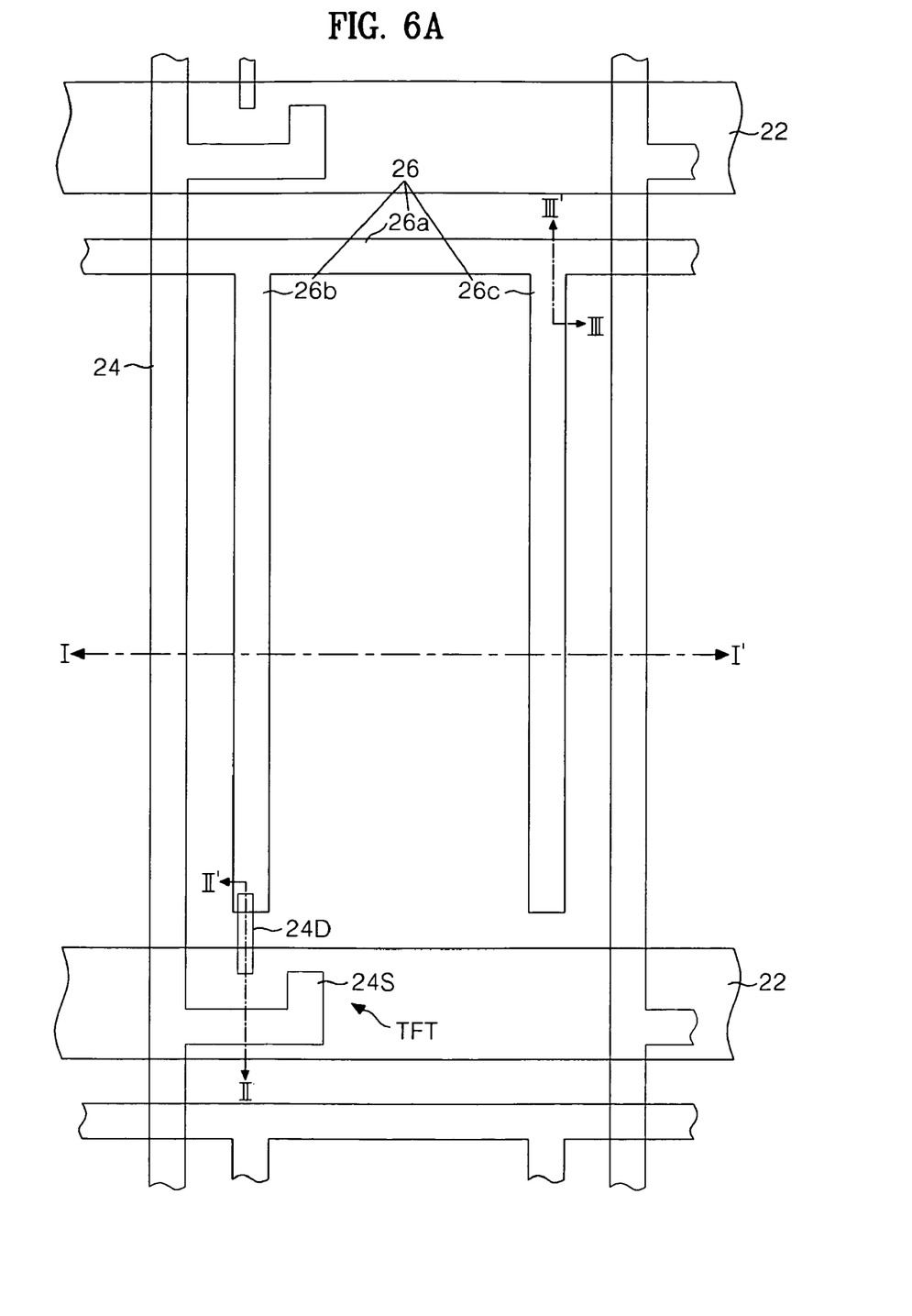
FIGS. 6A and 6B are plan and cross-sectional views illustrating a second mask process of the thin film transistor array in accordance with the embodiment of the present invention.
Figure 6B:
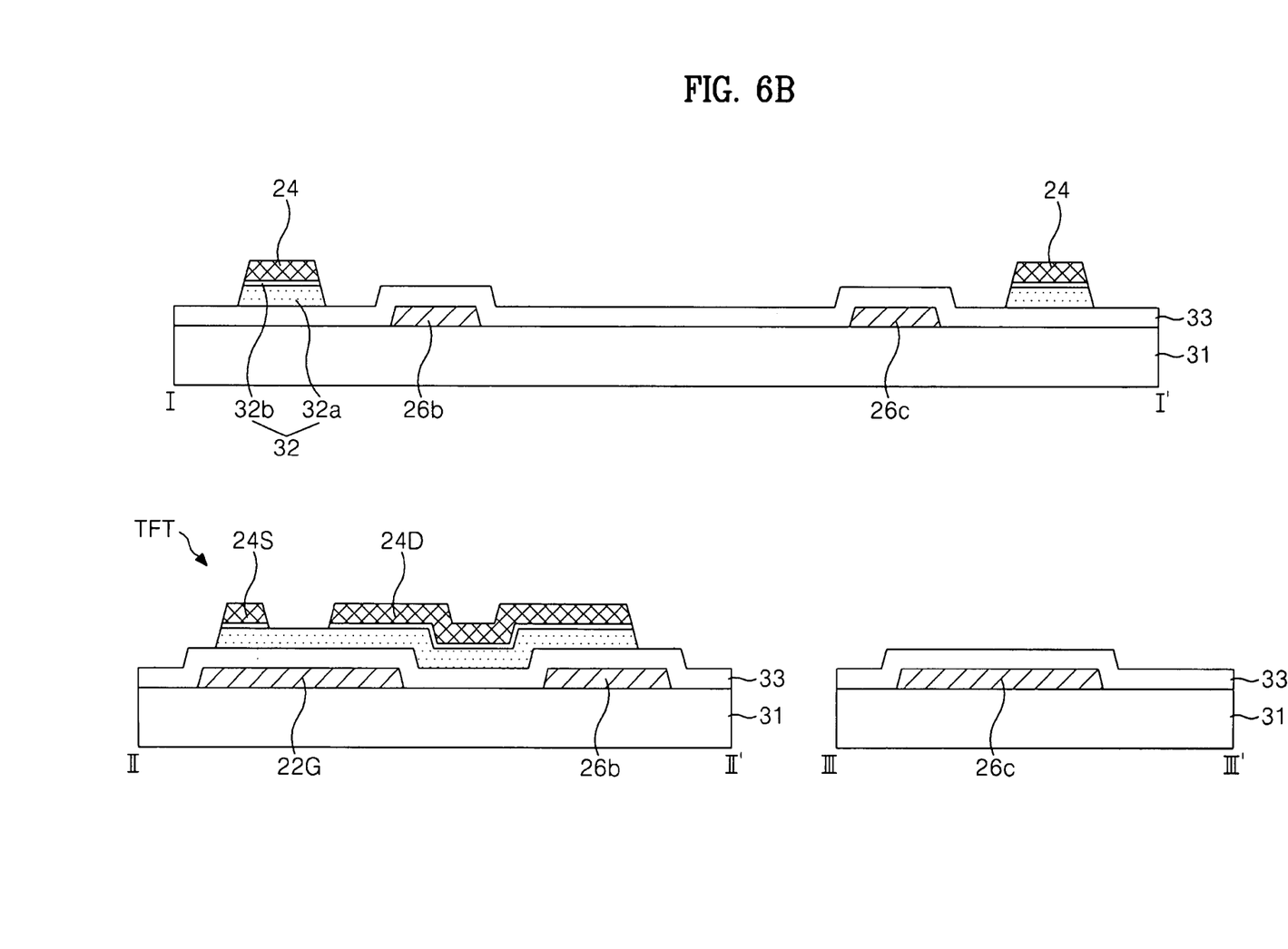

With reference to FIGS. 6A and 6B, a gate insulating film 33 covering the gate conductive pattern is formed on the substrate 31. Thereafter, a semiconductor pattern 32 and a source/drain conductive pattern including data lines 24, source electrodes 24S, and drain electrodes 24D are formed on the gate insulating film 33 through a second mask process.

The gate insulating film 33 is made of an inorganic insulating material, such as silicon oxide ($SiO_x$) or silicon nitride ($SiN_x$).

The semiconductor pattern 32 and the source/drain conductive pattern are obtained by stacking a semiconductor layer and a source/drain metal layer on the gate insulating film 33 and patterning the semiconductor layer and the source/drain metal layer through the second mask process including a photolithography process and an etching process.

Amorphous silicon or amorphous silicon doped with impurities ($N^+$ or $p^+$) is used as the semiconductor layer. Further, a single layer made of a metal material selected from the group consisting of Mo, Ti, Cu, AlNd, Al, Cr, Mo alloys, Cu alloys, and Al alloys, or at least a double layer obtained by stacking single layers made of the above metal material are used as the source/drain metal layer.

The second mask process uses a half-tone mask or a diffraction exposure mask, and thus it is possible to form the semiconductor pattern 32 and the source/drain conductive pattern with a single mask process. Thereby, the semiconductor pattern 32 formed under the source/drain conductive pattern overlaps with the source/drain conductive pattern.

Figure 7A:
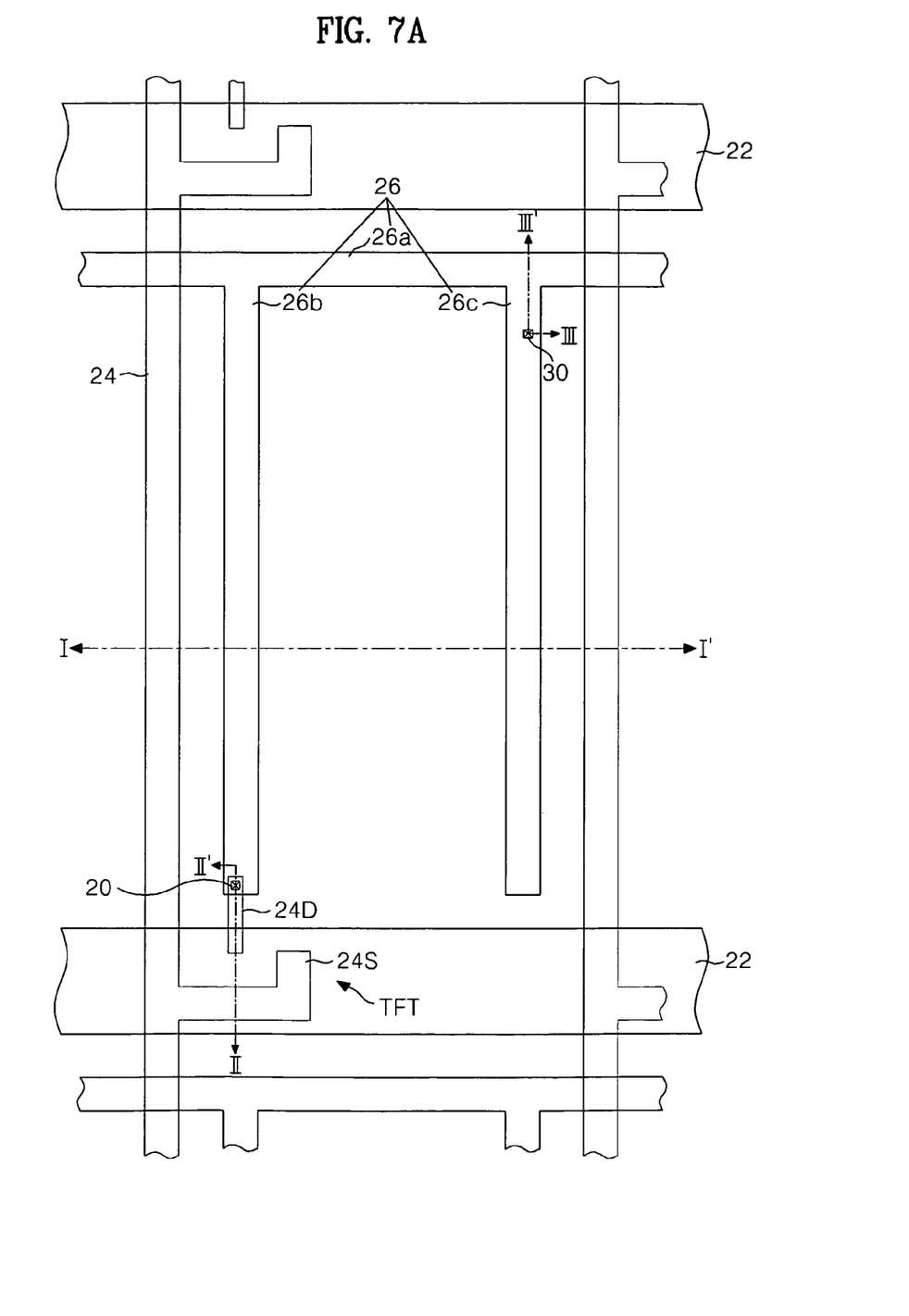
FIGS. 7A and 7B are plan and cross-sectional views illustrating a third mask process of the thin film transistor array in accordance with the embodiment of the present invention.
Figure 7B:
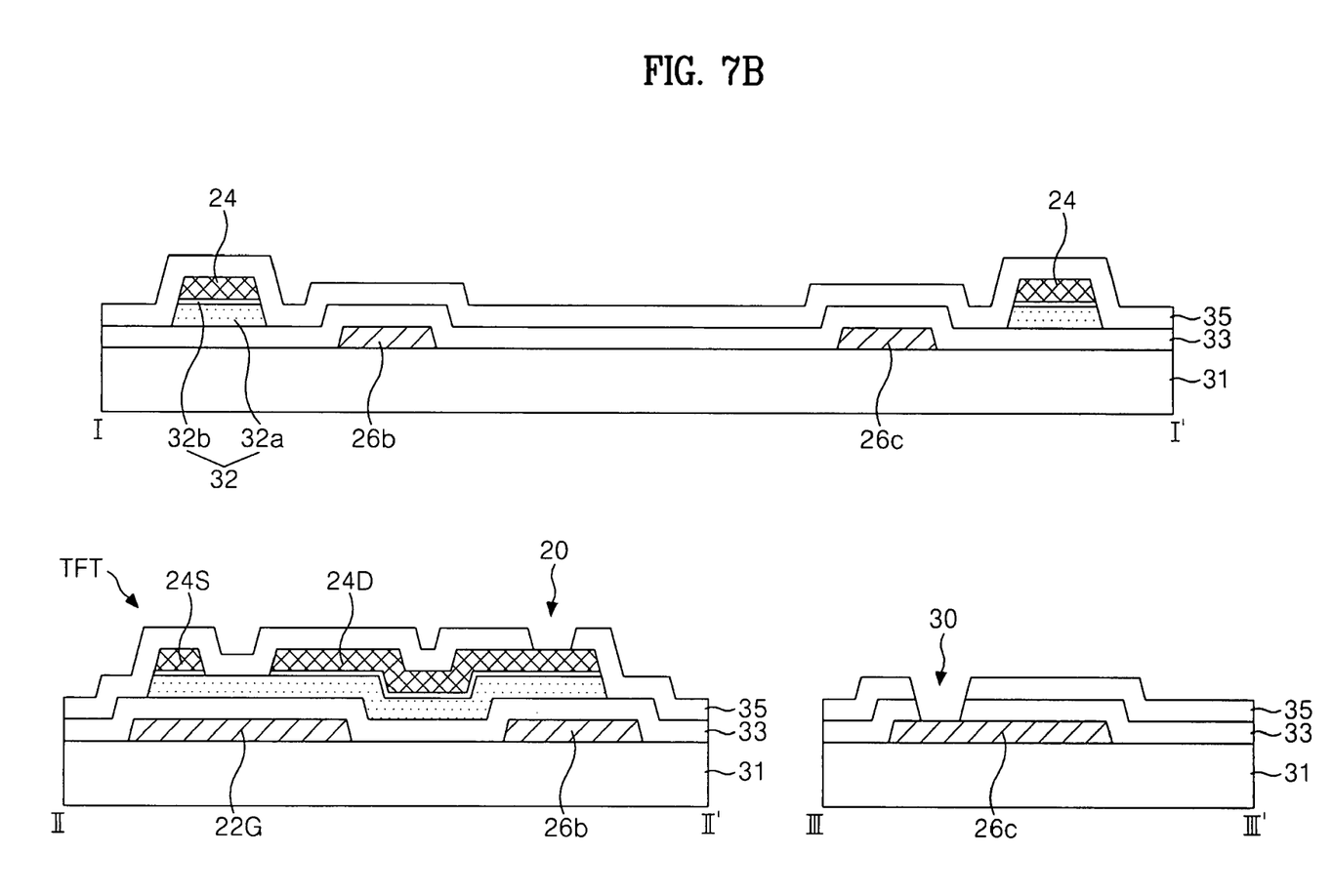

With reference to FIGS. 7A and 7B, a passivation film 35 covering the semiconductor pattern 32 and the source/drain conductive pattern is formed on the gate insulating film 33. Thereafter, pixel contact holes 20 and common line contact holes 30 are formed through a third mask process.

The passivation film 35 is made of an inorganic insulating material, such as silicon oxide ($SiO_x$) or silicon nitride ($SiN_x$), or an organic insulating material, such as an acrylic organic compound, benzo cyclobutene (BCB), perfluorocyclobutane (PFBC), Teflon, or Cytop.

The pixel contact holes 20 and the common line contact holes 30 are formed by patterning the gate insulating film 33 and the passivation film 35 through the third mask process including a photolithography process and an etching process.

Figure 8A:
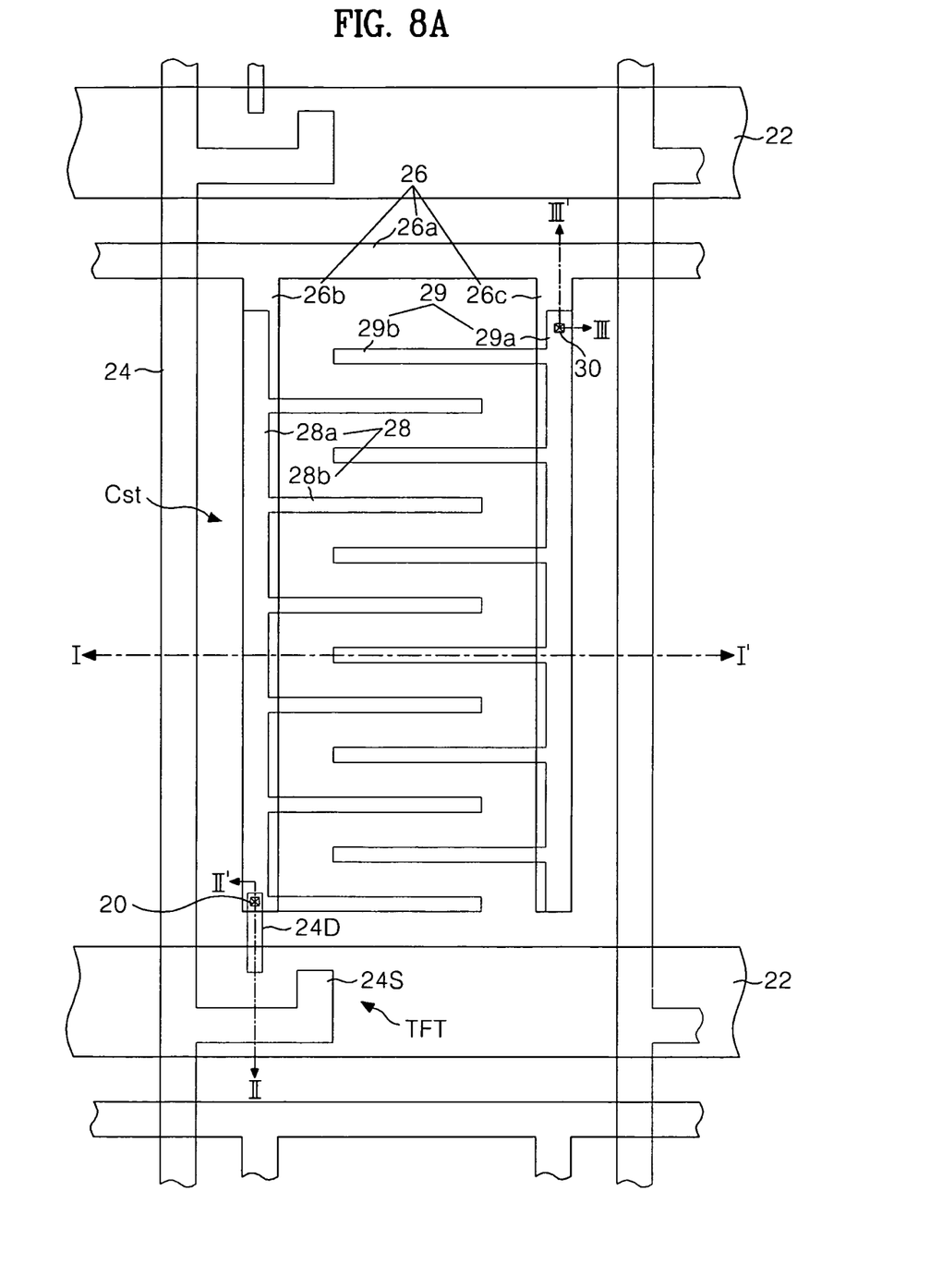
FIGS. 8A and 8B are plan and cross-sectional views illustrating a fourth mask process of the thin film transistor array in accordance with the embodiment of the present invention.
Figure 8B:
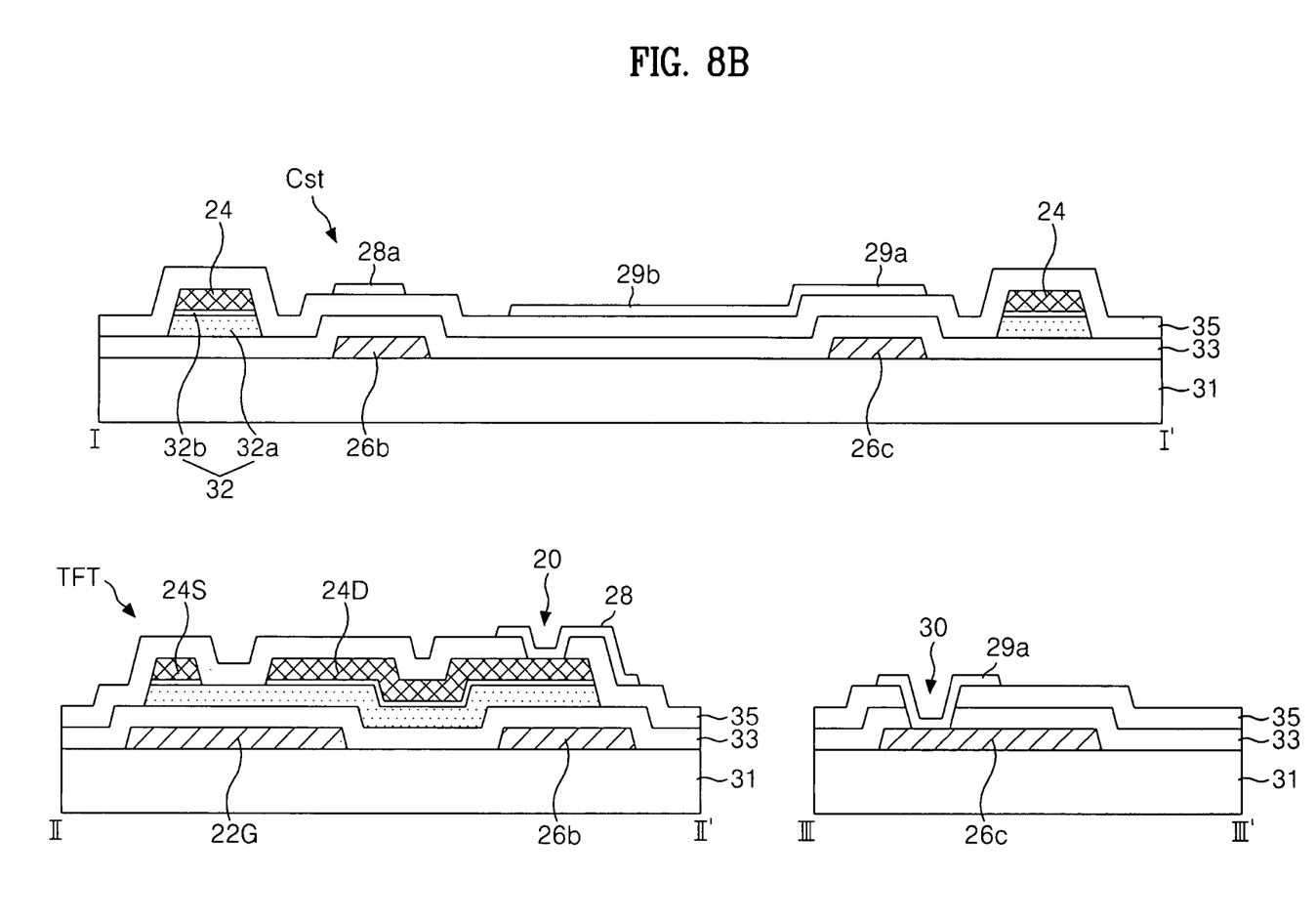

With reference to FIGS. 8A and 8B, a transparent conductive pattern including pixel electrodes 28 and common electrodes 29 is formed on the passivation film 35 through a fourth mask process.

The transparent conductive pattern is obtained by forming a transparent conductive metal layer on the passivation film 35 and patterning the transparent conductive metal layer through the fourth mask process including a photolithography process and an etching process.

The transparent conductive pattern is made of Indium Tin Oxide (ITO), Tin Oxide (TO), Indium Zinc Oxide (IZO), or Indium Tin Zinc Oxide (ITZO).

As described above, in a thin film transistor array of a horizontal electronic field applying type in accordance with one embodiment of the present invention, the edge of one side of the pixel electrode adjacent to the common electrode at the overlapping portion between the common line and the pixel electrode is formed on the inside of the edge of one side of the common line, and thus an electronic field formed between the edge of the pixel electrode and the common electrode is distorted by the edge of the common line being closer to the common electrode than the edge of the pixel electrode. Thereby, liquid crystals disposed between the edge of the pixel electrode and the common electrode at the overlapping portion are driven by the electronic field distorted by the edge of the common line, such that major axes of the liquid crystals are oblique to transmission axes of upper and lower polarizing plates, and thus contribute to the brightness of a liquid crystal display device.

Therefore, the thin film transistor array in accordance with the embodiment of the present invention widens a region, which contributes to brightness, thereby enhancing the brightness of a liquid crystal display device of a horizontal electronic field applying type.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A thin film transistor array of a horizontal electronic field applying type, comprising:
a gate line and common line separated from the gate line;
a data line crossing with the gate line to define pixel region and insulated from the gate line by a gate insulating film;
a TFT connected to the gate line and the data line in the pixel region;
a pixel electrode on a passivation film overlapping with the common line in the pixel region and connected to the TFT; and
a common electrode on the passivation film opposed to the pixel electrode in the pixel region and connected to the common line,
wherein the width of the pixel electrode at the overlapping portion between the common line and the pixel electrode is narrower than the width of the common line, and the first edge of one side of the pixel electrode adjacent to the common electrode is formed on the inside of the first edge of one side of the common line adjacent to the common electrode,
wherein the second edge of the other side of the pixel electrode adjacent to the data line is positioned on the same vertical line with the second edge of the other side of the common line adjacent to the data line.

2. The thin film transistor array according to claim 1, wherein a horizontal distance between the first edge of one side of the pixel electrode and the first edge of one side of the common line is 1~2 μm.

3. The thin film transistor array according to claim 1, wherein the common line includes:
   a horizontal part being parallel with the gate line;
   a first vertical part protruding from the horizontal part to the pixel region parallel with the data line, and overlapping with the pixel electrode; and
   a second vertical part protruding from the horizontal part to the pixel region parallel with the data line, and being separated from the first vertical part.

4. The thin film transistor array according to claim 3, wherein the pixel electrode includes:
   a pixel electrode connection part overlapping with the first vertical part; and
   a plurality of pixel electrode finger parts protruding from the pixel electrode connection part to a space formed between the first and second vertical parts.

5. The thin film transistor array according to claim 4, wherein the common electrode includes:
   a common electrode connection part overlapping with the second vertical part; and
   a plurality of common electrode finger parts protruding from the common electrode connection part to the space formed between the first and second vertical parts, and being disposed in parallel with the plurality of pixel electrode finger parts such that the plurality of common electrode finger parts and the plurality of pixel electrode finger parts alternate with each other.

6. The thin film transistor array according to claim 4, wherein the first vertical part and the pixel electrode connection part, which overlap with each other on condition that the gate insulating film and the passivation film are interposed therebetween, form a storage capacitor.

7. The thin film transistor array according to claim 4, wherein the width of the pixel electrode connection part is 3~5 μm.

8. A method for fabricating thin film transistor array of a horizontal electronic field applying type, comprising:
   forming a gate line and common line separated from the gate line;
   forming a gate insulating film
   forming a data line crossing with the gate line to define pixel region and insulated from the gate line by the gate insulating film;
   forming a TFT connected to the gate line and the data line in the pixel region;
   forming a passivation film;
   forming a pixel electrode on the passivation film overlapping with the common line in the pixel region and connected to the TFT; and
   forming a common electrode on the passivation film opposed to the pixel electrode in the pixel region and connected to the common line,
   wherein the width of the pixel electrode at the overlapping portion between the common line and the pixel electrode is narrower than the width of the common line, and the first edge of one side of the pixel electrode adjacent to the common electrode is formed on the inside of the first edge of one side of the common line adjacent to the common electrode,
   wherein the second edge of the other side of the pixel electrode adjacent to the data line is positioned on the same vertical line with the second edge of the other side of the common line adjacent to the data line.

9. The method according to claim 8, wherein a horizontal distance between the first edge of one side of the pixel electrode and the first edge of one side of the common line is 1~2 μm.

10. The method according to claim 8, wherein the common line includes:
   a horizontal part being parallel with the gate line;
   a first vertical part protruding from the horizontal part to the pixel region parallel with the data line, and overlapping with the pixel electrode; and
   a second vertical part protruding from the horizontal part to the pixel region parallel with the data line, and being separated from the first vertical part.

11. The method according to claim 10, wherein the pixel electrode includes:
   a pixel electrode connection part overlapping with the first vertical part; and
   a plurality of pixel electrode finger parts protruding from the pixel electrode connection part to a space formed between the first and second vertical parts.

12. The method according to claim 11, wherein the common electrode includes:
   a common electrode connection part overlapping with the second vertical part; and
   a plurality of common electrode finger parts protruding from the common electrode connection part to the space formed between the first and second vertical parts, and being disposed in parallel with the plurality of pixel electrode finger parts such that the plurality of common electrode finger parts and the plurality of pixel electrode finger parts alternate with each other.

13. The method according to claim 11, wherein the first vertical part and the pixel electrode connection part, which overlap with each other on condition that the gate insulating film and the passivation film are interposed therebetween, form a storage capacitor.

14. The method according to claim 11, wherein the width of the pixel electrode connection part is 3~5 μm.

* * * * *